(12) United States Patent
Pan et al.

(10) Patent No.: US 6,969,627 B2
(45) Date of Patent: Nov. 29, 2005

(54) LIGHT-EMITTING DIODE AND THE MANUFACTURING METHOD OF THE SAME

(75) Inventors: Shyi-Ming Pan, Changhua (TW); Jenq-Dar Tsay, Taipei (TW); Ru-Chin Tu, Tainan (TW); Jung-Tsung Hsu, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/436,133

(22) Filed: May 13, 2003

(65) Prior Publication Data

US 2004/0115845 A1 Jun. 17, 2004

(30) Foreign Application Priority Data

Dec. 13, 2002 (TW) ................................ 91136184 A

(51) Int. Cl.7 ............................................. H01L 21/00
(52) U.S. Cl. ........................ 438/39; 438/412; 438/503; 438/94
(58) Field of Search ............................. 438/39, 68, 69, 438/33, 41, 44, 412, 503, 507, 40, 94, FOR 458; 257/E33.003, E33.006

(56) References Cited

U.S. PATENT DOCUMENTS

| 6,229,160 | B1 * | 5/2001 | Krames et al. ................ 257/94 |
| 2002/0028564 | A1 * | 3/2002 | Motoki et al. .............. 438/460 |
| 2002/0117695 | A1 * | 8/2002 | Borges et al. .............. 257/279 |
| 2003/0020087 | A1 * | 1/2003 | Goto et al. .................. 257/103 |

* cited by examiner

*Primary Examiner*—George Fourson
*Assistant Examiner*—Julio J. Maldonado
(74) *Attorney, Agent, or Firm*—Birch, Stewart, Kolasch & Birch, LLP

(57) ABSTRACT

The specification discloses a light-emitting diode and the corresponding manufacturing method. A GaN thick film with a slant surface is formed on the surface of a substrate. An epitaxial slant surface is naturally formed using the properties of the GaN epitaxy. An LED structure is grown on the GaN thick film to form an LED device. This disclosed method and device can simplify the manufacturing process. The invention further uses the GaN thick film epitaxial property to make various kinds of LED chips with multiple slant surfaces and different structures. Since the surface area for emitting light on the chip increases and the multiple slant surfaces reduce the chances of total internal reflections, the light emission efficiency of the invention is much better than the prior art.

10 Claims, 3 Drawing Sheets

LIGHT-EMITTING DIODE AND THE MANUFACTURING METHOD OF THE SAME

BACKGROUND OF THE INVENTION

1. Field of Invention

The invention relates to a light-emitting diode and the manufacturing method for it. More particularly, it relates to a light-emitting diode and the corresponding fabrication method with a lower manufacturing difficulty and cost.

2. Related Art

The light-emitting diode (LED) uses the intrinsic property of semiconductors to emit light, whose principle is different from that of a normal lamp. Therefore, the LED is called a clod light source. Moreover, the LED has the advantages of being durable, light, energy-efficient, and not having mercury. Therefore, the illumination industry likes LED's very much.

Generally speaking, the LED is usually formed from epitaxy of the III-V family mixed crystal compounds such as GaP and GaN. Since the index of refraction of the LED's is greater than the exterior and the conventional LED's are mainly cubic in shape, light beams generated by the LED with an incident angle larger than the threshold angle will be totally reflected at the diode/air interface back into the diode. The four interfaces of the cubically symmetric diode crystal are parallel to one another, causing the above-mentioned light beams to totally reflect within the LED. As a result, the light-emitting efficiency of the LED is much lower than its internal quantum efficiency. A solution to this deficiency is to change the crystal shape of the LED.

In accord with the current semiconductor machining technology, the first example that has successfully used this method is disclosed in the U.S. Pat. No. 6,229,160, a truncated inverted pyramid (TIP) LED. According to that patent, the side surfaces of the AlGaInP/GaP LED crystal are made into a pyramid shape so that the four interfaces are not parallel to one another. This configuration can effectively guide the beams out, increasing the light-emitting efficiency by a factor of two. However, the TIP LED is formed by direct mechanical machining. This method can only apply to AlGaInP/GaP red diodes. It utilizes the feature that a four-element material can be conveniently machined to form the TIP LED. The GaN LED's, on the other hand, are mostly epitaxy on sapphires. As the sapphires are very hard, mechanical machining is almost impossible. There has not been any breakthrough in this direction.

The U.S. Cree, Inc. is successful in making TIP LED's using GaN. They use the property that machining for SiC is much easier than that for sapphires to polish the SiC substrate. Using this method, the GaN LED can be made into a TIP shape. However, the crystal lattices of GaN and SiC, and the SiC substrate will absorb ultraviolet (UV) light, affecting the light-emitting efficiency of the UV GaN LED. Nevertheless, the white-light LED based upon the UV GaN LED is believed to be an ideal illuminating material in the next generation.

Although directly using the GaN substrate to make the InGaN/GaN LED can be made into the TIP shape using mechanical machining, the slant surfaces formed by mechanical machining will contain a layer with residual stress after the InGaN/GaN epitaxy is grown on the GaN substrate. Such a layer absorbs light and is not easy to be removed. Therefore, it is harmful to the LED. Furthermore, the GaN substrate has a lower yield and a higher cost. Its market price is much higher than the SiC substrate and the sapphire substrate. Therefore, it is hard to be commercialized.

SUMMARY OF THE INVENTION

To solve the problems in the existing manufacturing procedures, the invention provides an LED and the manufacturing method thereof. A GaN thick film with a slant surface is formed on a substrate surface. Utilizing special properties of GaN epitaxy, an epitaxial slant surface is naturally formed. The GaN thick film is further grown with an LED structure, forming an LED crystal. Therefore, there is no need to use additional mechanical machining to make an LED structure with a slant surface.

The LED formed using the above method is comprised of a substrate with a GaN thick film formed on the surface and a diode structure formed on the GaN thick film. The side surface of the GaN thick film and the substrate surface have an angle naturally formed due to the special crystal property of GaN. The GaN thick film is a mixture of several III-V family compounds. For example, the $Al_XGa_{(1-X-Y)}In_YN$ film has $0 \leq X,Y < 1$ and $0 \leq X+Y < 1$. The diode structure formed on the GaN thick film surface consists of an n-GaN-series III-V family compound and a p-GaN-series III-V family compound. In particular, the n-GaN-series III-V family compound and the p-GaN-series III-V family compound are in electrically communications with low-resistance ohmic contact electrodes to provide a forward bias. The diode structure further contains an active layer between the n-GaN-series III-V family compound and the p-GaN-series III-V family compound as its light-emitting region.

Moreover, according to the disclosed method, the low-resistance ohmic contact electrodes of the n-GaN-series III-V family compound, the active layer, and the p-GaN-series III-V family compound can be formed on the upper and lower sides of the LED. This means can shrink the size of the device, increasing the light emission efficiency and yield.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The disclosed LED and manufacturing method utilizes the epitaxial growth characters of GaN to fabricate LED's. Based upon this, various kinds of LED's with multiple slant sides, different structures, and better light emission efficiencies can be made.

Figure 1:
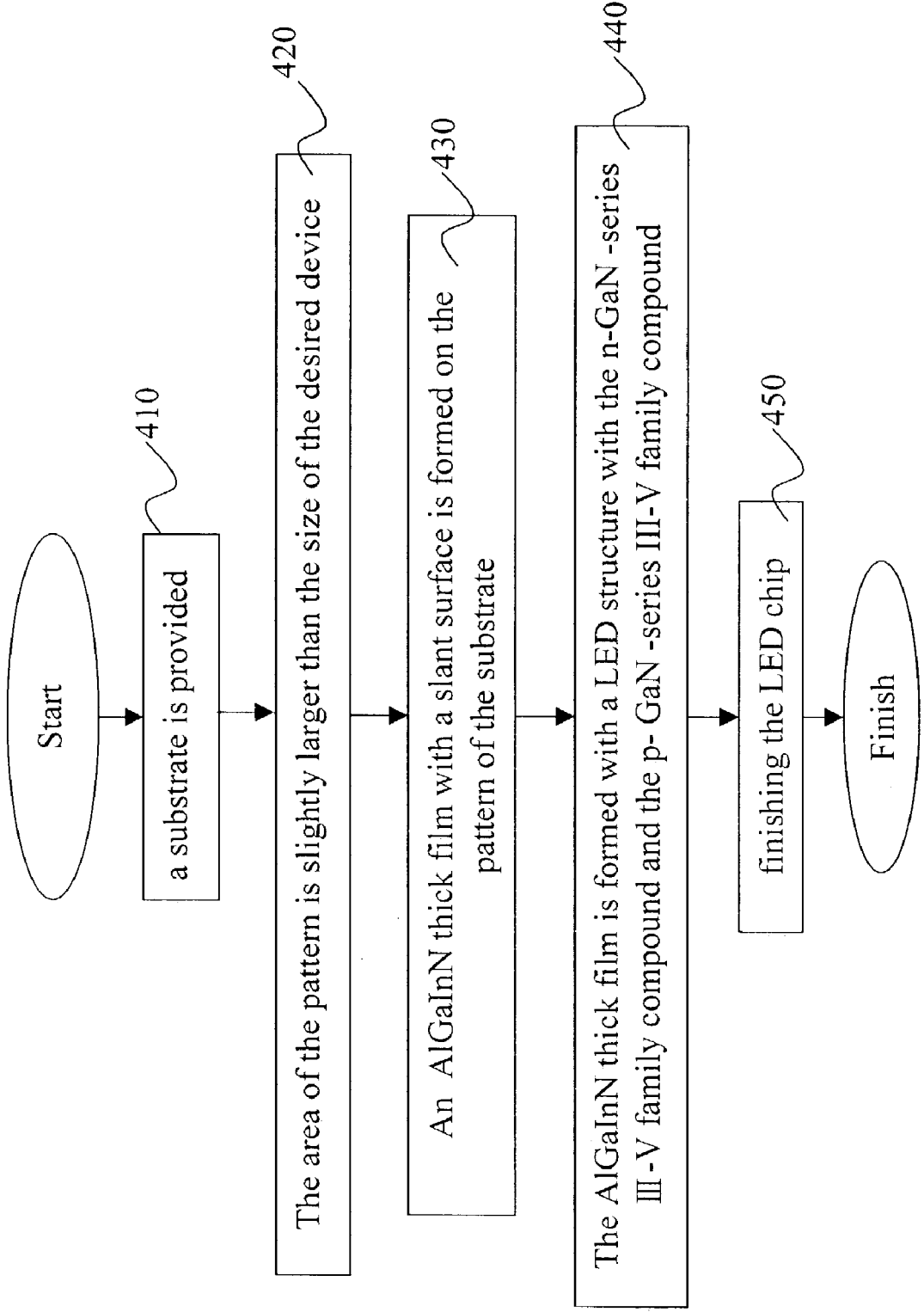
FIG. 1 is a flowchart of the disclosed manufacturing process.

We use FIG. 1 to explain the manufacturing procedure of the invention. First, a substrate is provided (step 410). Afterwards, the surface of the substrate is formed with a pattern for selectively area growing epitaxy. The area of the pattern is slightly larger than the size of the desired device (step 420). An AlGaInN thick film with a slant surface is formed on the pattern of the substrate (step 430). Such a slant surface is naturally formed as a result of the special property of the GaN epitaxy. The AlGaInN thick film is formed with a LED structure with the n-GaN-series III-V family compound and the p-GaN-series III-V family compound (step 440). Finally, a p-type low-resistance ohmic contact electrode is formed on the surface of the p-GaN-series III-V family compound, and an n-type low-resistance ohmic contact electrode is formed on the surface of the n-GaN-series III-V family compound, finishing the LED chip (step 450). In particular, the LED structure further contains an active layer as the light-emitting region. The surfaces of the n-GaN-series III-V family compound and the p-GaN-series III-V family compound are in electrical communications with the low-resistance ohmic contact electrodes, providing a forward bias. The invention also contains the step of removing the substrate using laser, which simplifies the chip cutting process of cutting the crystal. The yield is thus increased, whereas the manufacturing cost is lowered.

Figure 2:
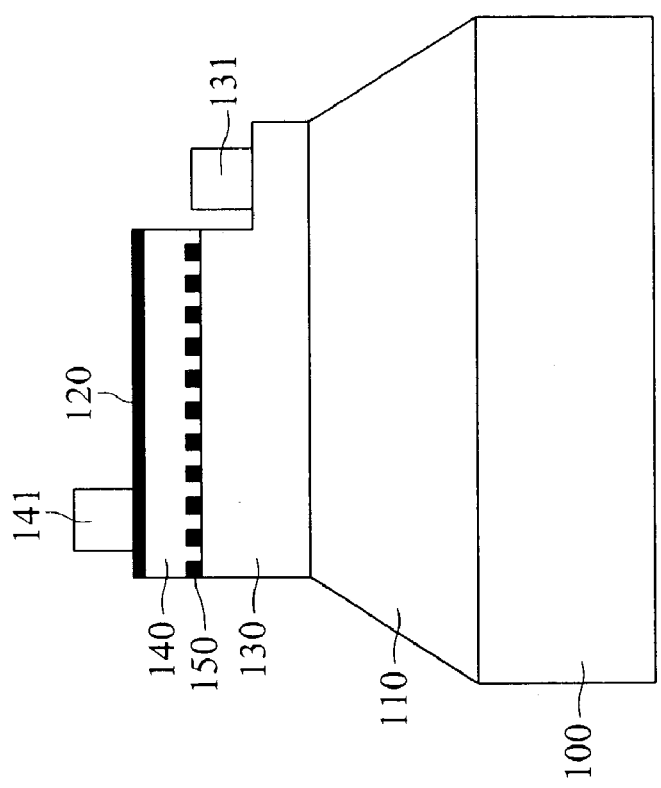
FIG. 2 is a schematic view of the first embodiment.

The LED of the invention can have several kinds of structures. With reference to FIG.2, the first embodiment of the invention contains a substrate 100, an AlGaInN thick film 110 with a slant surface, and an LED structure. The AlGaInN thick film 110 is an epitaxy formed on the surface of the substrate 100. The LED structure is comprised of an n-GaN-series III-V family compound 130, an active layer 150, and a p-GaN-series III-V family compound 140. The surface of the p-GaN-series III-V family compound 140 has a combination of a transparent contact layer (TCL) and a p-type low-resistance ohmic contact electrode 141. The surface of the n-GaN-series III-V family compound 130 has an n-type low-resistance ohmic contact electrode 131. The n-GaN-series III-V family compound 130, the active layer 150, and the p-GaN-series III-V family compound 140 are formed in order on the surface of the AlGaInN thick film 110.

Figure 3:
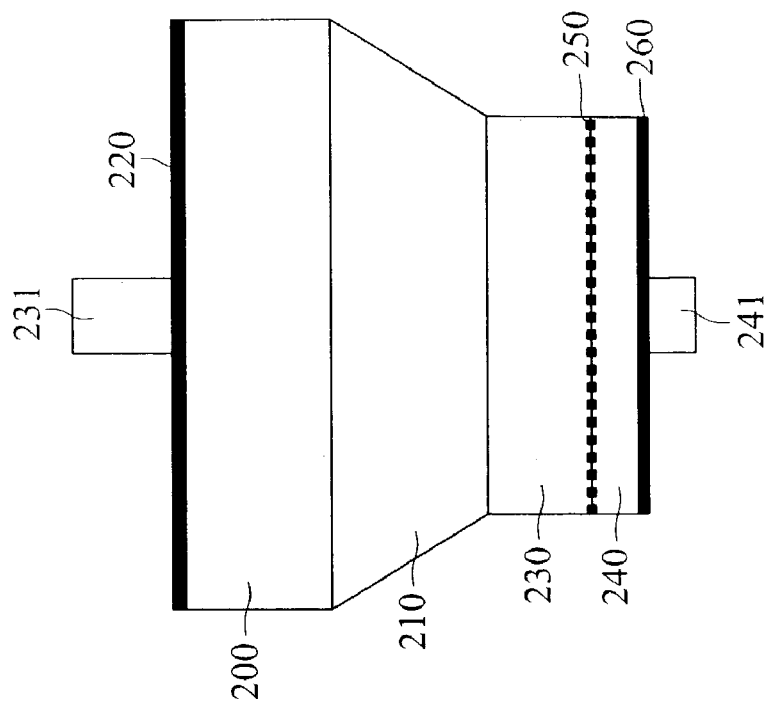
FIG. 3 is a schematic view of the second embodiment.

The invention can also use a transparent conductive substrate to make the LED. In this embodiment, the low-resistance ohmic contact electrodes of the n-GaN-series III-V family compound, the active layer, and the p-GaN-series III-V family compound can be formed on the upper and lower surfaces of the LED. This can minimizes the size of the device while at the same time increasing the light emission efficiency and yield. Please refer to FIG. 3, where the structure contains: an n-type transparent conductive substrate 200, an AlGaInN thick film 210 with a slant surface, an LED structure. One surface of the n-type transparent conductive substrate 200 has a combination of a TCL 220 and an n-type low-resistance ohmic contact electrode 231. The AlGaInN thick film 210 is an epitaxy formed on the other surface of the n-type transparent conductive substrate 200. The LED structure is comprised of an n-GaN-series III-V family compound 230, an active layer 250, and a p-GaN-series III-V family compound 240. The surface of the p-GaN-series III-V family compound 240 has a combination of a p-type low-resistance ohmic contact electrode 241 and a reflective metal electrode 260.

Figure 4:
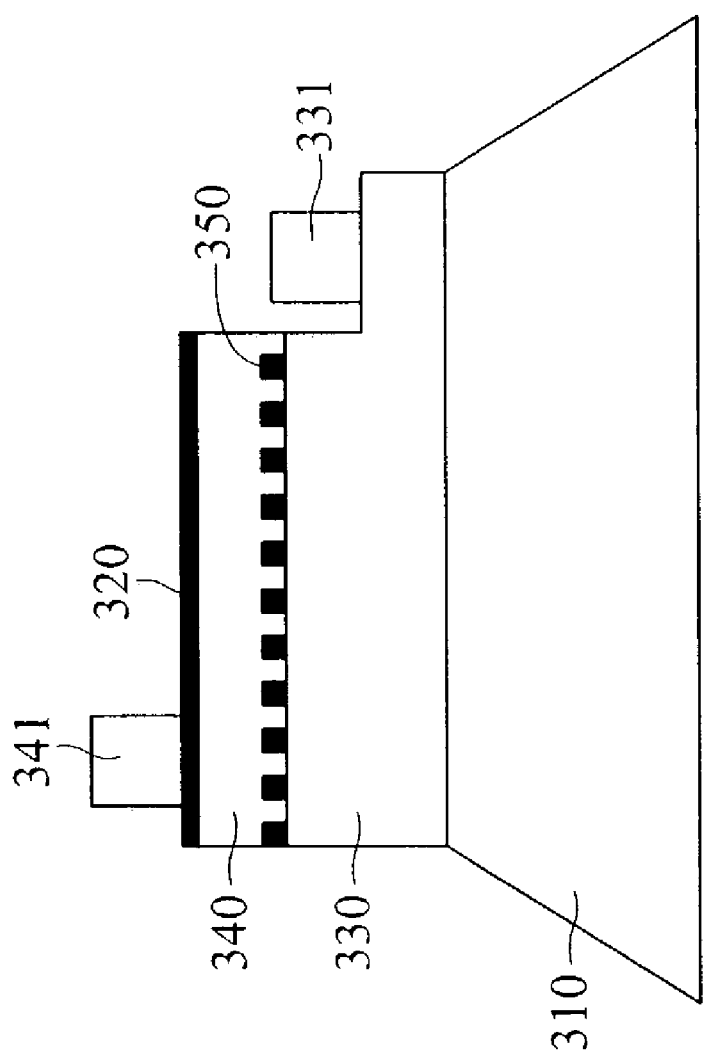
FIG. 4 is a schematic view of the third embodiment.

In another structure of the invention, the substrate is removed to simplify the LED chip cutting process. This can simultaneously increase the yield but lower the cost. A third embodiment of the invention is shown in FIG. 4. The structure contains: an AlGaInN thick film 310 with a slant surface and an LED structure. The LED structure is comprised of an n-GaN-series III-V family compound 330, an active layer 350, and a p-GaN-series III-V family compound 340. The surface of the n-GaN-series III-V family compound 330 has an n-type low-resistance ohmic contact electrode 331. The surface of the p-GaN-series III-V family compound 340 has a combination of a p-type low-resistance ohmic contact electrode 341 and a TCL 320.

As described above, the substrate for the epitaxial growth of an AlGaInN thick film with a slant surface according to the invention can be a sapphire, SiC, Si, GaAs, AlN, LiAlO2, and LiGaO2. The n-type transparent conductive substrate can be an n-GaN, an n-ZnO, and an n-SiC. The method for the epitaxial growth of an AlGaInN thick film with a slant surface is the hydride vapor phase epitaxy (HVPE). The inner diameter of the pattern for selectively area growing epitaxy is larger than 150 $\mu$m. The shape of the pattern can be a quadrilateral, hexagon, or circle, which determines the shape of the natural slant surface of the thick film. The thickness of the AlGaInN thick film with a slant surface is above 20 $\mu$m. Due to the properties of the GaN epitaxy, the bottom surface of the GaN thick film and its side surface subtends an angle $\alpha$, where $43°\leq\alpha\leq62°$. The p-type low-resistance ohmic contact electrode and the n-type low-resistance ohmic contact electrode can be transparent low-resistance ohmic contact electrodes. The p-type low-resistance ohmic contact electrode can be a p-type transition metal oxide semiconductor or a mixture of a p-type transition metal oxide semiconductor and heavy metals. The LED structure further contains an active layer between the n-GaN-series III-V family compound and the p-GaN-series III-V family compound as the light-emitting region. The active layer can be a double-heterostructure (DH), a single-quantum well (SQW) or a multiple-quantum well (MQW).

Certain variations would be apparent to those skilled in the art, which variations are considered within the spirit and scope of the claimed invention.

What is claimed is:

1. A manufacturing method of a light-emitting diode (LED) comprising the steps of:

providing a substrate;

forming a pattern on a surface of the substrate for selective area epitaxy growth;

forming a GaN film with a slant surface over the pattern using an epitaxy growth method, wherein the slant surface is naturally formed as a result of the properties of GaN and the upper surface of the GaN film is a plane with an area suitable for device users; and forming an LED structure on the GaN film, wherein the LED structure contains an n-GaN-series III-V family compound and a p-GaN-series III-V family compound, and p-GaN-series III-V family compound is in electrical communications with a p-type low-resistance ohmic contact electrode and the n-GaN-series III-V family compound is in electrical communications with an n-type low-resistance ohmic contact electrode for providing a forward bias;

said LED structure being directly formed on said area of said upper surface of said GaN film by said method, so as to form an LED diode on the GaN film having a slant surface, which determines the size of the LED diode and increases light emission efficiency and yield.

2. The method of claim 1, wherein the GaN film is an $Al_xGa_{(1-X-Y)}In_YN$ film with $0\leq X<1$, $0\leq Y<1$ and $0\leq X+Y<1$.

3. The method of claim 1, further comprising the step of removing the substrate.

4. The method of claim 1, wherein the method of forming the GaN film with a slant surface is the hydride vapor phase epitaxy (HVPE).

5. The method of claim 1, wherein the substrate is selected from the group consisting of sapphire, SiC, Si, GaAs, and AlN substrates.

6. The method of claim 1, wherein the substrate is a transparent conductive substrate.

7. The method of claim 1, wherein a thickness of the GaN film is above 20 μm.

8. The method of claim 1, wherein an inner diameter of the pattern is greater than 150 μm.

9. The method of claim 1, wherein the pattern has a shape selected from the group consisting of a quadrilateral, a hexagon and a circle.

10. The method of claim 1, wherein the bottom surface and the side surface of the GaN film subtend an angle α, where $43° \leq \alpha \leq 62°$.

* * * * *